United States Patent
Ajmera et al.

(10) Patent No.: US 6,437,377 B1
(45) Date of Patent: Aug. 20, 2002

(54) LOW DIELECTRIC CONSTANT SIDEWALL SPACER USING NOTCH GATE PROCESS

(75) Inventors: Atul C. Ajmera, Wappingers Falls; Ka Hing (Samuel) Fung, Beacon; Victor Ku, Tarrytown; Dominic J. Schepis, Wappingers Falls, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/768,525

(22) Filed: Jan. 24, 2001

(51) Int. Cl.$^7$ ............................................. H01L 27/10
(52) U.S. Cl. ..................... 257/204; 257/408; 257/336
(58) Field of Search ................................ 257/204, 408, 257/336; 438/303, 592, 164, 302, 305

(56) References Cited

U.S. PATENT DOCUMENTS

| | | | |
|---|---|---|---|
| 5,102,816 A | | 4/1992 | Manukonda et al. |
| 5,627,097 A | | 5/1997 | Venkatesan |
| 5,663,586 A | * | 9/1997 | Lin .............................. 257/336 |
| 5,773,331 A | * | 6/1998 | Solomon et al. ............ 438/164 |
| 5,851,890 A | * | 12/1998 | Tsai et al. .................... 438/303 |
| 6,110,783 A | | 8/2000 | Burr |
| 6,140,192 A | * | 10/2000 | Huang et al. ................ 438/305 |
| 6,218,250 B1 | * | 4/2001 | Hause et al. ................ 438/302 |
| 6,239,472 B1 | * | 5/2001 | Shenoy ........................ 257/408 |

FOREIGN PATENT DOCUMENTS

JP 020011135645 * 5/2001

* cited by examiner

*Primary Examiner*—David Nelms
*Assistant Examiner*—Thinh Nguyen
(74) *Attorney, Agent, or Firm*—Whitham, Curtis & Whitham, P.C.; Jay H. Anderson

(57) ABSTRACT

A notched gate MOS device includes either an encapsulated low dielectric material or encapsulated air or a vacuum at the bottom of a notched gate. Due to the low dielectric constant at the site of interface between the gate and the source/drain, the capacitance loss at that site is significantly reduced.

19 Claims, 3 Drawing Sheets

LOW DIELECTRIC CONSTANT SIDEWALL SPACER USING NOTCH GATE PROCESS

BACKGROUND OF THE INVENTION

1. Field of the Invention

The present invention generally relates to computer chip manufacture, and more particularly to a structure and process that reduces sidewall capacitance between the gate and source/drain of a metal oxide semiconductor (MOS) device such as a metal oxide semiconductor field effect transistor (MOSFET).

2. Background Description

In MOSFETs, the total overlap capacitance is composed of both the inner and the outer fringing components. Prior to this invention, it was not recognized the critical role that the dielectric constant of the sidewall material plays in the output fringing overlap capacitance.

U.S. Pat. No. 5,627,097 to Venkatesan et al. describes a method of making a complementary metal oxide semiconductor (CMOS) device with reduced MOSFET parasitic capacitance between the substrate and source/drain. The Venkatesan et al. disclosure does not address gate to source/drain overlap capacitance.

U.S. Pat. No. 5,663,586 to Lin is specifically directed to the spacer construction in an FET. Lin contemplates a double spacer where the current drive is improved by using an additional conducting spacer. The Lin configuration; however, would increase the sidewall capacitance due to the presence of the additional spacer.

U.S. Pat. No. 5,102,816 to Manukonda et al. describes a method of forming a thin spacer adjacent to the gate sidewall with precise dimension control. However, the structure proposed in Manukonda et al. does not provide any advantages in terms of parasitic sidewall capacitance when compared to conventional designs.

U.S. Pat. No. 6,110,783 to Burr describes a method for forming a notched gate oxide asymmetric MOS device that potentially offers higher drive current than conventional devices. The notched structure is used to fabricate the asymmetric source/drain doping profile. Burr does not describe or suggest reducing sidewall capacitance.

Thus, while the level of skill in fabricating MOS devices is high, and the ability to control the formation of spacers, notch structures, and other aspects of the MOS device is well understood, prior to this invention little progress has been made in terms of identifying and reducing gate to source/drain overlap capacitance.

SUMMARY OF THE INVENTION

It is an object of the present invention to provide structures for and methods of reducing gate to source/drain overlap capacitance in a MOSFET device.

According to the invention, there is a proportional relationship between the overlap capacitance for gate to source/drain in a MOSFET and the dielectric constant (k) of the material used in the sidewall spacer. This invention stems from the discovery that low k sidewall spacers can be used to reduce gate to source/drain capacitance. The total overlap capacitance is composed of the inner and outer fringing components. Usually, silicon nitride is used as the spacer, and silicon nitride has a k slightly higher than four (4). By replacing the silicon nitride spacer with a low-k material, the fringing component can be reduced. For example, if the low-k material has a k of 1, the fringing component can be reduced by a factor of 4 and this could potentially reduce the total overlap capacitance by 30%. However, low k materials are generally more fragile, and have more difficulty in holding their shape at higher temperatures. This would make using low k materials difficult to use in high temperature processing, upon exposure to silicide temperatures, and during normal thermal junction cycling (typically 1000 degrees C.).

The invention contemplates a notched gate filled with a low-k filler such as phosphorous doped low temperature oxide, SILK, fluorinated silicate glass (FSG), and other porous materials. In general, the low-k filler selected for this application should have a k of less than 3, it should not react with the gate material, and it should not decompose upon normal junction thermal cycling. Subsequently, the low-k filler can be encapsulated such that problems related to material compatibility with silicidation and problems related to whether the shape will hold up at high temperature are reduced. As an alternative embodiment, an air or gas filled cavity can be created under the notch. Due to the lack of a dielectric constant for air and other gases, this would give the lowest overlap capacitance possible in a CMOS technology.

BRIEF DESCRIPTION OF THE DRAWINGS

The foregoing and other objects, aspects and advantages will be better understood from the following detailed description of the preferred embodiments of the invention with reference to the drawings, in which.

DETAILED DESCRIPTION OF A PREFERRED EMBODIMENT OF THE INVENTION

Figure 1:
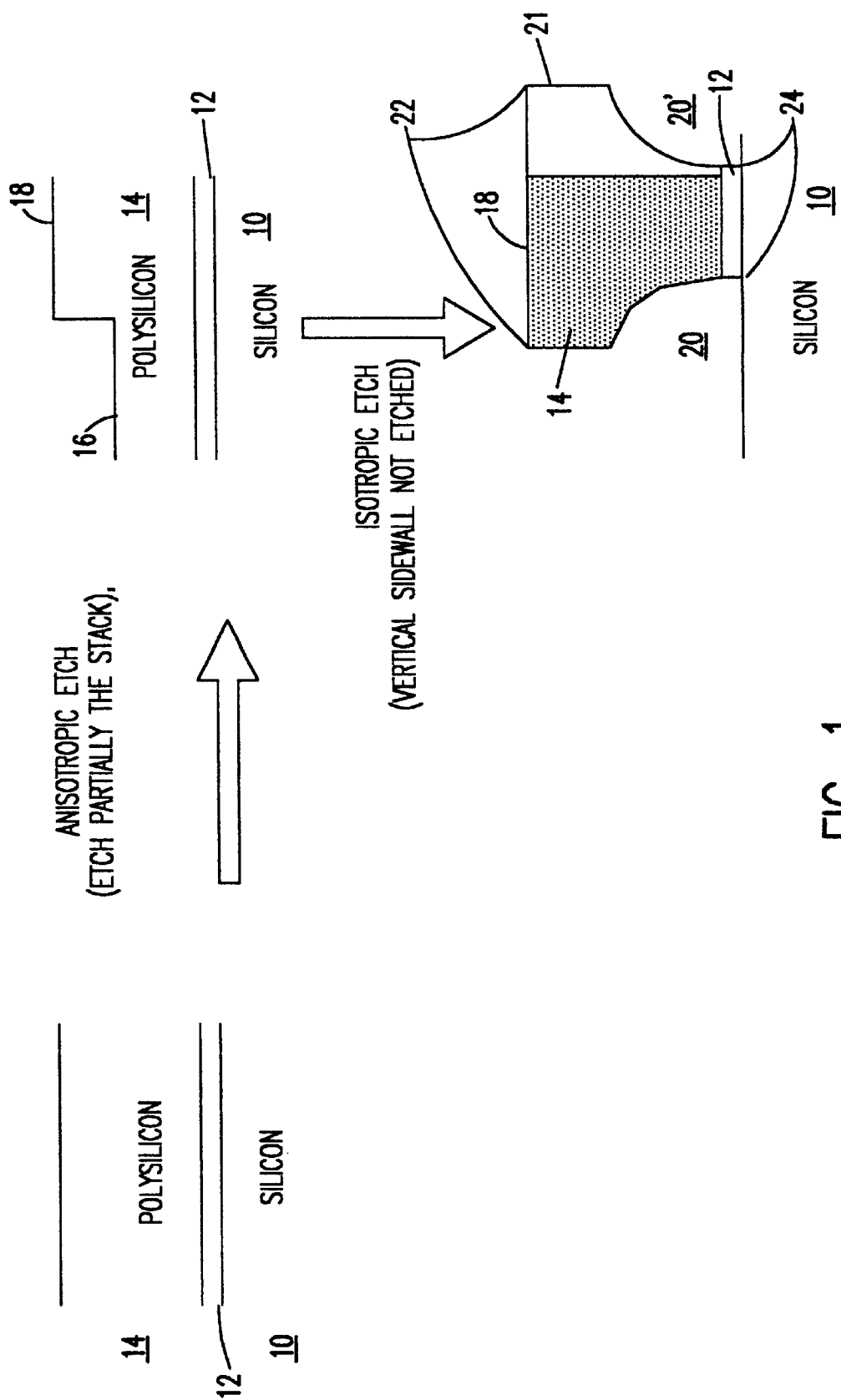
FIG. 1 is a schematic drawing showing the formation of a notched polysilicon gate on the surface of a silicon substrate, the polysilicon gate serving as the gate electrode in a MOS device.

Referring to FIG. 1, there is shown a semiconductor substrate 10 which may be silicon, galium arsenide, or any other suitable material, and may be in wafer, chip or other suitable forms. The substrate 10 should be one that can be implanted with dopants such as N+, P+, and other dopant materials, for producing MOS devices such as MOSFETs. The substrate 10 will have an insulator 12 on its surface, such as epitaxially grown silicon dioxide or any other suitable material. A layer of conductive material 14 which will form the gate of the MOS device initially overlies the insulator 12. The conductive material 14 is preferably polysilicon, but could be other conductors such as metals and the like.

The conductive material 14 is first patterned to remove a portion of the layer. This can be accomplished using masks and other lithographic techniques, and by using an anisotropic etch that will etch material that is exposed directly downward from the exposed portion. The partial etch of the stack is conducted such that the conductive material includes a low height region 16 and a high height region 18. Actually, the patterning and etching process is preferably used to define a plurality of gate conductors and other electronic devices and pathways on the substrate 10. Thus, the high height region 18 would be bordered on both sides by low height regions 16, and there would be a plurality of high height regions 18 and low height regions 16 over the surface of the stack (for simplicity, only one low height region is depicted). The partial etch can be performed by a variety of different methods. All that is required is that the etch be anisotropic, and be conducted for a duration and under such conditions, that the conductive material 14 is not completely removed from the surface of the stack, but assumes a configuration with one or more low height regions 16.

Then, the conductive material 14 is etched again. However, this time the conductive material 14 is exposed to an isotropic etch which evenly etches in all directions. As shown in the last part of the scheme in FIG. 1, the conductive material 14 is masked (or passivated) at its high height regions 18 both at the top surface and the sidewall which extends to the low height regions 16, such that the result of the isotropic etch is removal of all of the exposed conductive material from the low height regions, and to create a notched region 20 under a portion of the high height region 18. As shown by the dashed lines 21, notched regions 20' can appear at any other location on the surface of the substrate 10 depending on the circuit design. The width between notched regions 20 and 20' can vary widely; however, it should be understood that, due to the anisotropic partial etch followed by an isotropic etch of the conductive material at the site of the anisotropic partial etch, the result is a conductive material 14 that is patterned such that its top width (defined as the width between endpoints 22) is larger than its bottom width (defined as the width between endpoints 24). Furthermore endpoints 22 extend over both endpoints 24. The invention contemplates using a low k filler in this notched region 20 to reduce gate electrode to source/drain overlap capacitance.

Figure 2:
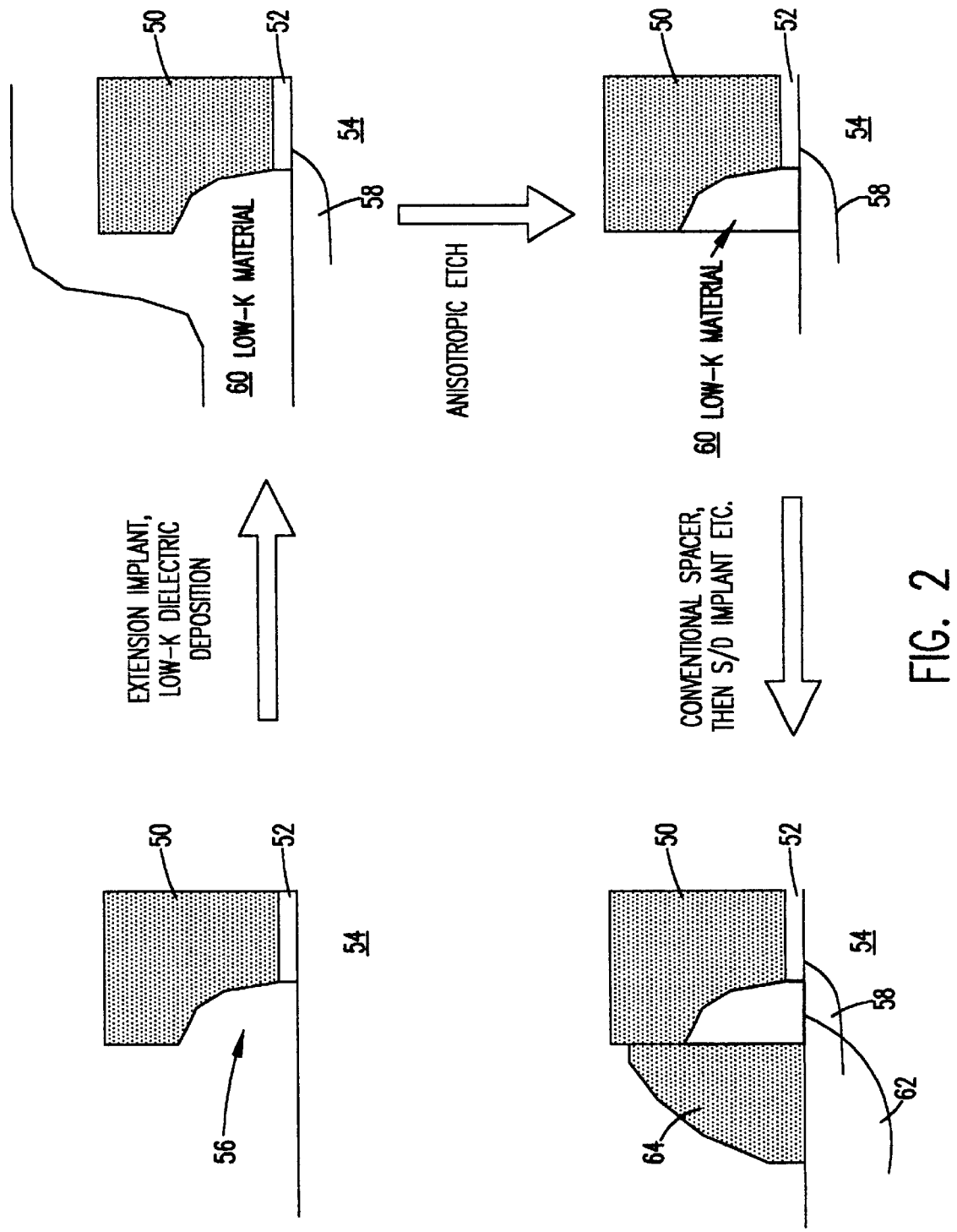
FIG. 2 is a schematic drawing showing on embodiment of the invention where a low k sidewall spacer is positioned in the notched region of the polysilicon gate to reduce gate to source/drain overlap capacitance.

FIG. 2 shows a first embodiment of the invention which utilizes the notched gate structure 50 which is perched on an insulator pad 52 on substrate 54. The notched gate structure 50 is a conductive material (preferably polysilicon) and is preferably obtained according to the procedures described in conjunction with FIG. 1, and most preferably has a notched region 56 on both sides of the notched gate structure 50 as discussed in conjunction with FIG. 1 (two notched regions not shown in FIG. 2 for simplicity). An implant creates doped region or extension implant 58 in substrate 54 which can form part of the source or drain of a MOSFET. The implant 58 can be positive or negative depending on the needs of the circuit and can be formed by any of many conventional processes, and can include arsenic, boron and other dopants. The doped region 58 extends within substrate 54 laterally away from the base of the notched gate. A low k material layer 60, such as phosphorous doped oxide ([K] P doped silicon dioxide-preferably low temperature oxide), SILK, FSG, and other porous materials, overcoats the substrate 54. The low k material 60 can be deposited by any of many conventional processes. Deposition of the low k material 60 is conducted in a manner that the notched region 56 becomes filled with the low k material.

Subsequently, an anisotropic etch is performed. The anisotropic etch removes the low k material 60 from the surface of he notched gate structure 50 and substrate 54, and leaves the top side wall of the notched gate structure 50 clean while low k material 60 remains in the notched region. As discussed above, anisotropic etching (as opposed to isotropic etching) is required in order to leave unexposed low k material 60 in the notched region. Finally, a deep source/drain implant 62 is performed to create the source and drain regions, and a spacer 64 is deposited adjacent the notched gate structure 50. The spacer 64 can be silicon nitride or other suitable materials, and can be deposited as a layer and subsequently patterned, or can be deposited selectively or by other means. The spacer 64 serves the function of protecting the low k material 60 in the notch region 56 from thermal processing and silicidation exposure which may occur on further processing, thus, it should fully encapsulate the low k material 60 between the spacer 64, notched gate structure 50, and substrate 54.

Figure 3:
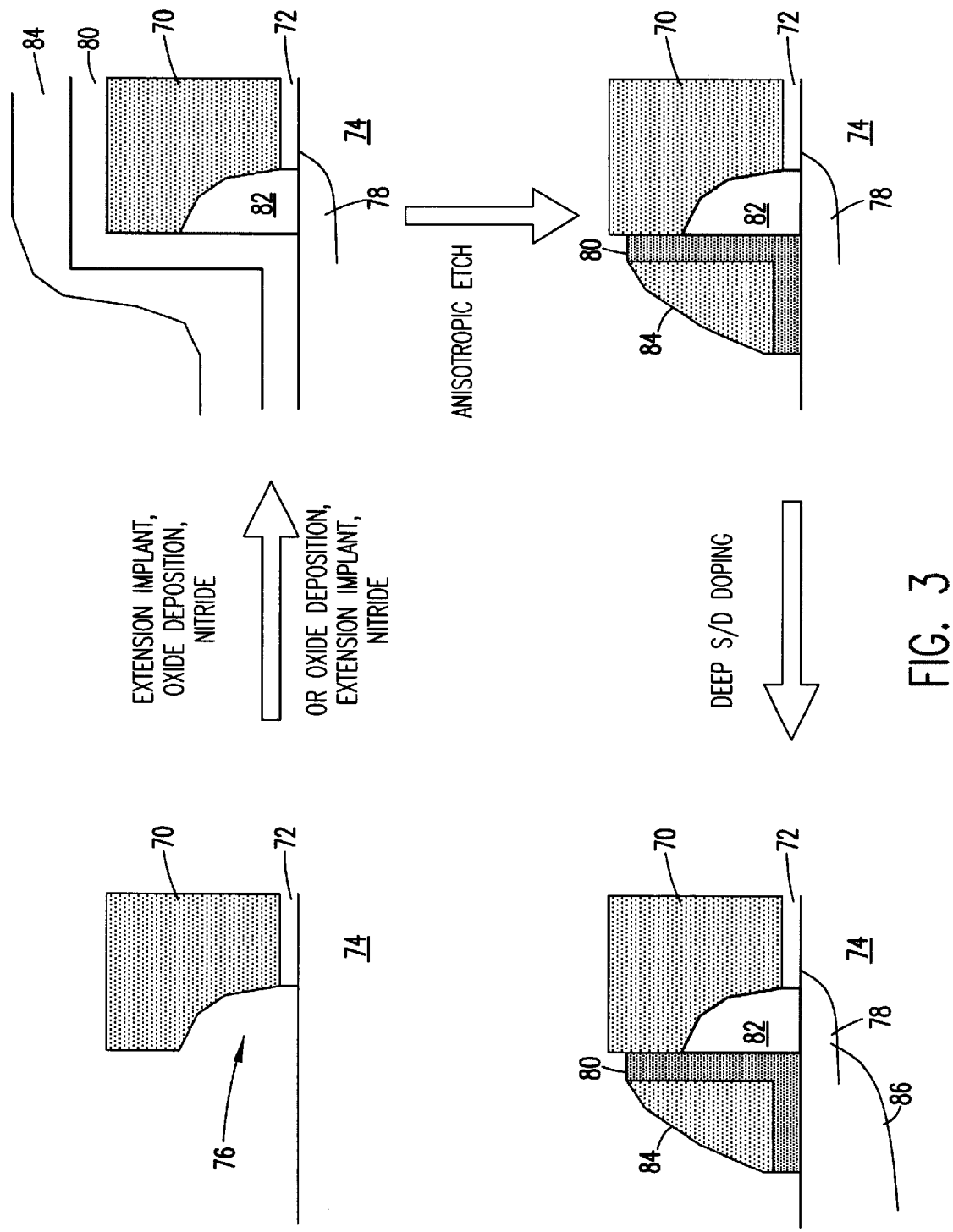
FIG. 3 is a schematic drawing showing an alternate embodiment of the invention where air or another gas with low k (less than 3) properties is positioned in the notched region of the polysilicon gate and serves to reduce gate to source/drawin overlap capacitance.

FIG. 3 shows an alternative embodiment wherein air or other gases (e.g., nitrogen) are positioned in the notched region instead of a low k material (as shown in FIG. 2). Air and other gases have dielectric constants of 3 or below, and can serve the same function of decreasing capacitance overlap between the gate electrode and the source or drain. FIG. 3 shows a notched gate structure 70 which is perched on an insulator pad 72 on substrate 74. The notched gate structure 70 is a conductive material (preferably polysilicon) and is preferably obtained according to the procedures described in conjunction with FIG. 1 and most preferably has a notched region 76 on both sides of the notched gate structure 70 as discussed in conjunction with FIG. 1 (two notched regions not shown in FIG. 3 for simplicity).

The chief distinction between the embodiment of FIG. 3 and the embodiment of FIG. 2 is that FIG. 3 contemplates a non-conformal deposition of oxide 80 such that air 82 (or other gases present in the fabrication chamber) is trapped between the oxide layer 80, the substrate 74, and the notched gate structure 70 (i.e., air (or other gases) serve as the low k filler in this embodiment). As discussed in conjunction with FIG. 2, extension implants 78 can be formed in substrate 74. The extension implants 78 can be added before or after deposition of oxide. The entire structure can be overcoated with a layer of the material 84 which will ultimately be the outside spacer for the gate electrode. For example, the layer 84 can be silicon nitride or other suitable materials. Subsequently, an anisotropic etch is performed to remove the oxide layer 80 and layer 84 from the top surface of the notched gate structure 70 and portions of the top surface of the substrate 74. This leaves a spacer composed of oxide 80 and material 84. The spacer traps the air or other gas 82 between the notched gate structure 84, the spacer, and the substrate 74, and protects the region including the air or other gas 82 during subsequent processing steps such as silicidation. Deep source/drain implantation is also performed to make the source or drains 86.

In either embodiment, the low k filler (e.g., the low k material or air or other gases) in the notched regions of the gate electrode reduce the capacitance overlap of the gate electrode with the source/drain regions.

While the invention has been described in terms of its preferred embodiments, those skilled in the art will recognize that the invention can be practiced with modification within the spirit and scope of the appended claims.

We claim:

1. A gate structure for a MOS device, comprising:
   a semiconductor substrate;
   a notched gate positioned above said semiconductor substrate, said notched gate having a top and a bottom wherein a notched portion of said notched gate is located at said bottom of said notched gate;
   a low k filler positioned in said notched portion of said notched gate so as to reduce gate to source/drain overlap capacitance, said low k filler having a dielectric constant of 3 or less; and a spacer positioned adjacent to said notched gate and said material so as to fully encapsulate said low k filler between said spacer and said notched gate.

2. The gate structure of claim 1 wherein said low k filler is a low dielectric material.

3. The gate structure of claim 2 wherein said low dielectric material is selected from the group consisting of phosphorous doped oxide, SILK, fluorinated silicate glass, and porous materials.

4. The gate structure of claim 1 wherein said low k filler is a gas.

5. The gate structure of claim 4 wherein said gas is air.

6. The gate structure of claim 1 wherein said semiconductor substrate is silicon.

7. The gate structure of claim 1 wherein said spacer is silicon nitride.

8. The gate structure of claim 1 wherein said notched gate is a conductive material.

9. The gate structure of claim 8 wherein said conductive material is polysilicon.

10. The gate structure of claim 1 further comprising implant regions in said semiconductor substrate below said low k filler and extending laterally away from said notched gate.

11. A method of fabricating a gate structure for a MOS device, comprising the steps of:

anisotropically etching first portions of a conductive layer on a top surface of a substrate while protecting second portions of said conductive layer, said anisotropically etching step being performed such that said first portions assume a first height above said substrate and said second porions assume a second height above said substrate wherein said second height is relatively higher than said first height;

isotropically etching said conductive layer at said first portions while protecting said second portions, said isotropically etching step exposing said substate and removing notch regions from under said second portions of said conductive layer, said isotropically etching step defining a gate conductor;

positioning a low dielectric constant filler having a dielectric constant of 3 or less in the notch regions; and forming a spacer on said substrate adjacent the gate conductor so as to fully encapsulate said low k filler between said spacer and said notched gate.

12. The method of claim 11 wherein said positioning step is performed by depositing a low k material on said substrate in a manner which fills said notch regions, then pattering the low k material to leave said low k material in said notch regions of said gate electrode.

13. The method of claim 12 wherein said low k material is selected from the group consisting of phosphorous doped oxide, SILK, fluorinated silicate glass, and porous materials.

14. The method of claim 11 further comprising the step of implanting ions into said substrate.

15. The method of claim 11 wherein said positioning step is performed by trapping a gas between oxide layer, said gate conductor and said substrate in said notched regions of said gate conductor.

16. The method of claim 15 wherein trapping is performed by overcoating the gate conductor with an oxide layer.

17. The method of claim 11 wherein said step of forming a spacer is performed by overcoating said substrate and said gate conductor with a layer of material which will serve as said spacer, and then etching said layer to remove said material from a top surface of said gate conductor and from portions of said substrate but to leave said material on said substrate adjacent to said gate conductor.

18. The method of claim 17 wherein said layer of material is silicon nitride.

19. The method of claim 14 wherein said implanting step is performed at two different times to produce shallow extensions and deep source drain regions in said substrate.

* * * * *